(12) United States Patent
Sambandan et al.

(10) Patent No.: US 7,824,949 B2
(45) Date of Patent: Nov. 2, 2010

(54) STRUCTURE AND METHOD FOR FLEXIBLE SENSOR ARRAY

(75) Inventors: Sanjiv Sambandan, Palo Alto, CA (US); William S. Wong, San Carlos, CA (US); Rene A. Lujan, Sunnyvale, CA (US); Scott J. Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 171 days.

(21) Appl. No.: 11/963,008

(22) Filed: Dec. 21, 2007

(65) Prior Publication Data
US 2009/0159940 A1 Jun. 25, 2009

(51) Int. Cl.
*H01L 21/00* (2006.01)
(52) U.S. Cl. .......... 438/59; 257/444; 257/443; 257/E27.133; 438/57; 438/48
(58) Field of Classification Search .......... 257/E27.133, 257/292, 233, 53, 444, 443; 438/59, 57, 438/48
See application file for complete search history.

(56) References Cited

U.S. PATENT DOCUMENTS

| | | | |
|---|---|---|---|
| 5,619,033 A * | 4/1997 | Weisfield | ........ 250/208.1 |
| 6,717,152 B2 | 4/2004 | Izumi | |
| 6,856,670 B2 | 2/2005 | Hoheisel | |
| 7,078,702 B2 | 7/2006 | Ringermacher et al. | |
| 2002/0089026 A1 * | 7/2002 | Lu et al. | ........ 257/458 |
| 2004/0016886 A1 | 1/2004 | Ringermacher et al. | |
| 2006/0194357 A1 * | 8/2006 | Hsu et al. | ........ 438/28 |

OTHER PUBLICATIONS

P.I. Hsu, R. Bhattacharya, H. Gleskova, M. Huang, Z. Xi, Z. Suo, S. Wagner, and J.C. Sturm; Thin-film Transistor Circuits on Large-Area Spherical Surfaces; Applied Pyhysics Letters; vol. 81; No. 9; Aug. 26, 2002, pp. 1723-1725.
Pai-Hui Iris Hsu; A Dissertation Presented to the Faculty of Princeton University in Candidacy for the Degree of Doctor of Philosophy; Three-Dimensional Electronic Surfaces, Nov. 2003, 129 pages including title pages.

* cited by examiner

*Primary Examiner*—Thanh V Pham
*Assistant Examiner*—Maria Ligai
(74) *Attorney, Agent, or Firm*—Marger Johnson & McCollom PC

(57) ABSTRACT

A method of forming a sensor array. The method includes depositing a source/drain contact layer; depositing a semiconductor layer on the source/drain contact layer; and patterning the source/drain contact layer and the semiconductor layer substantially simultaneously, wherein the patterned semiconductor layer forms part of a sensor of the sensor array.

21 Claims, 6 Drawing Sheets

STRUCTURE AND METHOD FOR FLEXIBLE SENSOR ARRAY

GOVERNMENT FUNDING

This invention was made with Government support under contract No. 70NANB3H3029, awarded by the National Institute of Standards and Technology (NIST). The Government has certain rights in this invention.

BACKGROUND

This disclosure relates to sensor arrays and, in particular, to flexible sensor arrays.

During the deposition of image sensors on amorphous silicon thin film transistor (TFT) backplanes, a metal layer known as the contact metal/mushroom metal is used to contact a positive (p doped)-intrinsic-negative (n doped) (PIN) sensor to a TFT. In the case of flexible sensor arrays, this layer can cause undesired effects due to film stress and creation of electrical faults by contact with other metal layers.

The contact metal/mushroom metal is part of the connection between the TFT and the sensor. A via through an encapsulation layer over the TFT can connect the contact metal/mushroom metal to a TFT contact. The contact metal/mushroom metal layer can be disposed over the TFT. The mushroom metal shadows the TFT active region from light to minimize leakage current. However, this adds an additional layer between the TFT and the PIN sensor.

In the formation of a sensory array, after a TFT is encapsulated, an opening is formed in the encapsulation layer exposing a contact of the TFT. The mushroom metal is deposited over the encapsulation layer and contacts the TFT contact through the via. The n, i, and p layers of the PIN sensor are deposited on the mushroom metal. Accordingly, the creation of the connection between the TFT and the PIN sensor requires deposition and/or patterning processes separate from the TFT fabrication process.

DETAILED DESCRIPTION

Embodiments will be described with reference to the drawings. Embodiments include a sensor array having the source/drain (s/d) layer in contact with the sensor media. Accordingly, the pixel contact metal or mushroom metal can be eliminated by adding an ohmic contact layer to the s/d metal. As a result, the number of layers is reduced, not only reducing the complexity of production, but also reduces the probability of defects, increasing yield.

Figure 1:
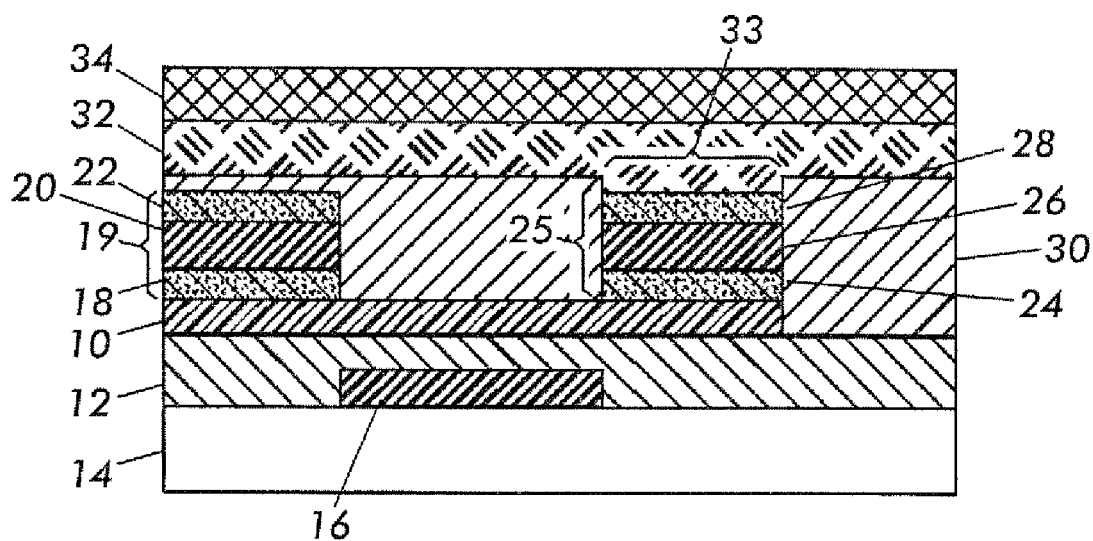
FIG. 1 is a cross-sectional view of a transistor and sensor in a sensor array according to an embodiment.

FIG. 1 is a cross-sectional view of a transistor and sensor in a sensor array according to an embodiment. The sensor array includes a substrate 14. The substrate can be glass, plastic, or any insulator coated rigid or flexible material. A gate contact 16 is formed on the substrate 14. A gate insulator 12 separates a semiconductor island 10 from the gate contact 16.

Two contact structures 19 and 25 are disposed on the semiconductor island 10. The first contact structure 19 includes contact layer 18, a conductive layer 20, and a doped semiconductor layer 22. The second contact structure 25 includes a contact layer 24, a conductive layer 26, and a first sensor semiconductor layer 28.

In an embodiment, the contact layers 18 and 24 can be n+ type semiconductor layers. Accordingly, the contact layers 18 can form ohmic contacts between the conductive layers 20 and 26 and the semiconductor island 10. An ohmic contact is a contact to a semiconductor that has substantially linear current-voltage characteristics. As a result, the conductive layers 20 and 26 can form source/drain contacts for the TFT.

An encapsulation layer 30 covers the contact structures 19 and 25, and the semiconductor island 10. An opening 33 in the encapsulation layer exposes the first sensor semiconductor layer 28. A second sensor semiconductor layer 32 is formed in the opening 33 and extends over the encapsulation layer 30. A third semiconductor layer 34 is formed on the second sensor semiconductor layer 32.

In an embodiment, the first sensor semiconductor layer 28 can be an n+ type semiconductor layer. The second sensor semiconductor layer 32 can be an intrinsic semiconductor layer. The third semiconductor layer 34 can be a p-type semiconductor layer. Accordingly, the first, second, and third semiconductor layers 28, 32, and 34 together form a PIN sensor. The n+ type semiconductor of the PIN sensor is directly connected to a conductive layer 26 forming a contact of a TFT. As a result, a mushroom metal layer is not needed to make the connection.

Figure 2:
FIGS. 2-9 are cross-sectional views illustrating a process of forming a transistor and sensor in a sensor array according to an embodiment.
Figure 3:
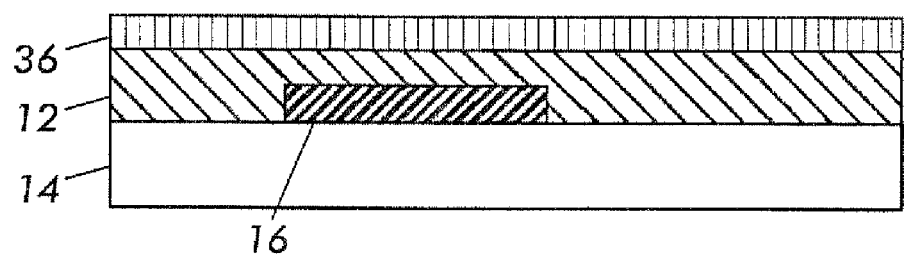

FIGS. 2-9 are cross-sectional views illustrating a process of forming a transistor and sensor in a sensor array according to an embodiment. FIG. 2 illustrates a substrate 14. In FIG. 3, a gate contact 16 is deposited on the substrate 14. A gate insulator 12 is deposited over the gate contact 16. A first semiconductor layer 36 is deposited over the gate insulator 12. The first semiconductor layer 36 can be formed from an intrinsic semiconductor.

As used in this disclosure, depositing, deposition, or the like, can refer to any technique of applying materials. For example, deposition can include chemical vapor deposition (CVD), electrochemical deposition (ECD), molecular beam epitaxy (MBE), or the like. In another example, depositing can include depositing by printing. For example, ink-jet printing can be used for depositing. Moreover, deposition is not limited to depositing a uniform layer. In contrast, deposition can include the patterned application of materials such as pattern-wise printing of materials through inkjet printing.

Figure 4:
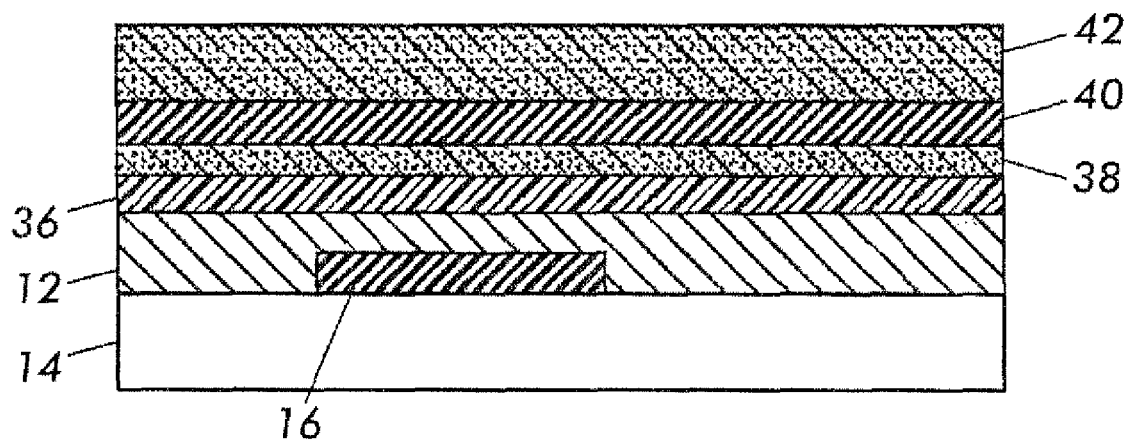

In FIG. 4, a second semiconductor layer 38, a conductive layer 40, and a third semiconductor layer 42 are deposited on the first semiconductor layer 36. As the conductive layer 40 can be patterned into source/drain contacts for a TFT, the conductive layer 40 can be referred to as a source/drain contact layer. In an embodiment, the second and third semiconductor layers 38 and 42 can be formed from n+ type semiconductors. The second semiconductor layer 38 can be selected to provide an ohmic contact between the conductive layer 40 and the first semiconductor layer 36. The third semiconductor layer 42 can, but need not be the same material as the second semiconductor layer 38. For example, the third semiconductor layer 42 can be selected for a semiconductor in a PIN sensor, while the second semiconductor layer 38 can be selected to optimize the ohmic contact to conductive layer 40.

In an embodiment, a thickness of the third semiconductor layer 42 can be larger than a desired thickness of a corresponding portion of the first sensor semiconductor layer 28.

Figure 5:
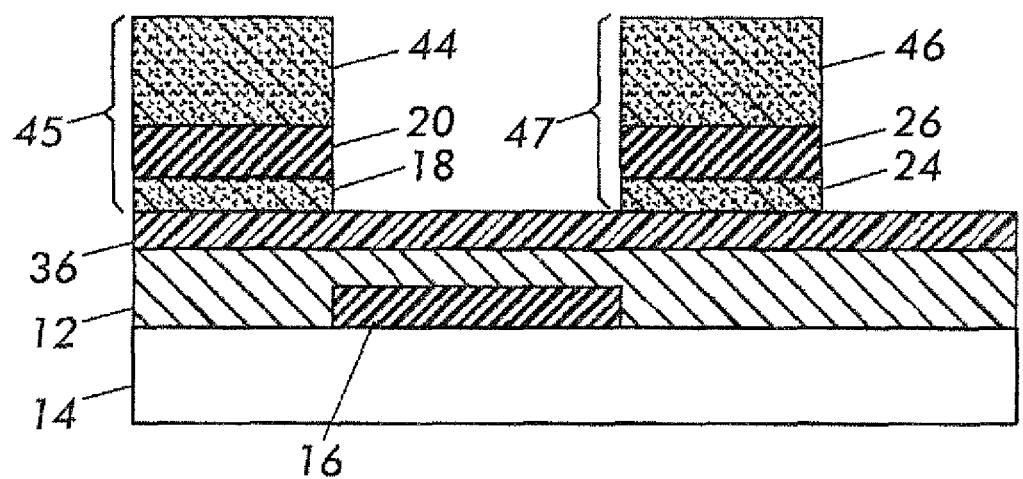

In FIG. 5, the second semiconductor layer 38, the conductive layer 40, and the third semiconductor layer 42 are patterned, forming contact structures 45 and 47. Accordingly, second semiconductor layer 38, conductive layer 40, and third semiconductor layer 42 are patterned into the contact layers 18 and 24, first and second conductive layers 20 and 26, and patterned third semiconductor layers 44 and 46. In an embodiment, due to the patterning of the conductive layer 40 and the third semiconductor layer 42, cross-sections of the conductive layer 26 and the patterned third semiconductor layer 46 can have substantially the same shape.

Figure 6:
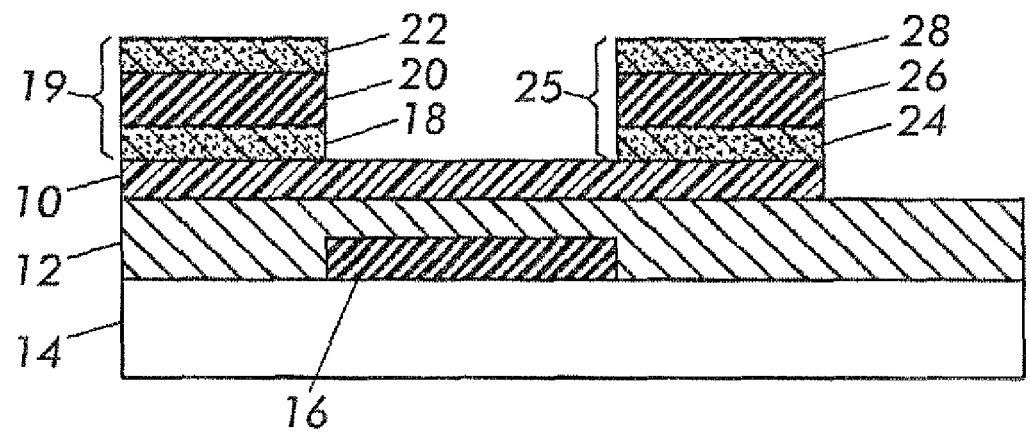

In FIG. 6, the first semiconductor layer 36 is patterned to form the semiconductor island 10. In this embodiment, the patterned third semiconductor layers 44 and 46 were not protected from the process used in patterning the first semiconductor layer 36. Accordingly, the patterned third semiconductor layers 44 and 46 can be etched and reduced in thickness.

As the thickness of the third semiconductor layer 42 was greater than the desired thickness of the first sensor semiconductor layer 28, when the first semiconductor layer 36 is patterned, the patterned third semiconductor layer 46 can be reduced in thickness to form the first sensor semiconductor layer 28. Similarly, the patterned third semiconductor layer 44 can be reduced in thickness to form the semiconductor layer 22.

Figure 7:
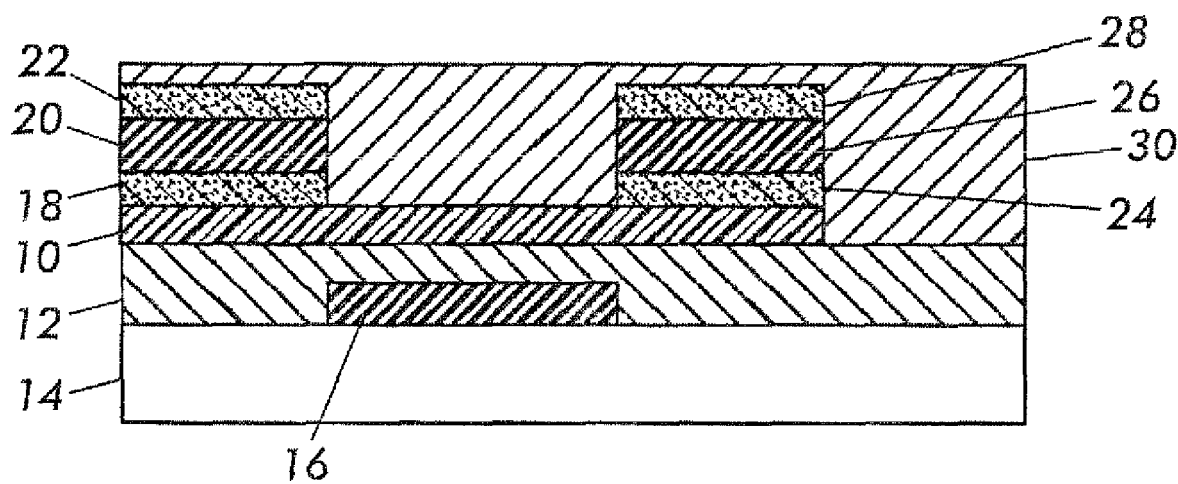
Figure 8:
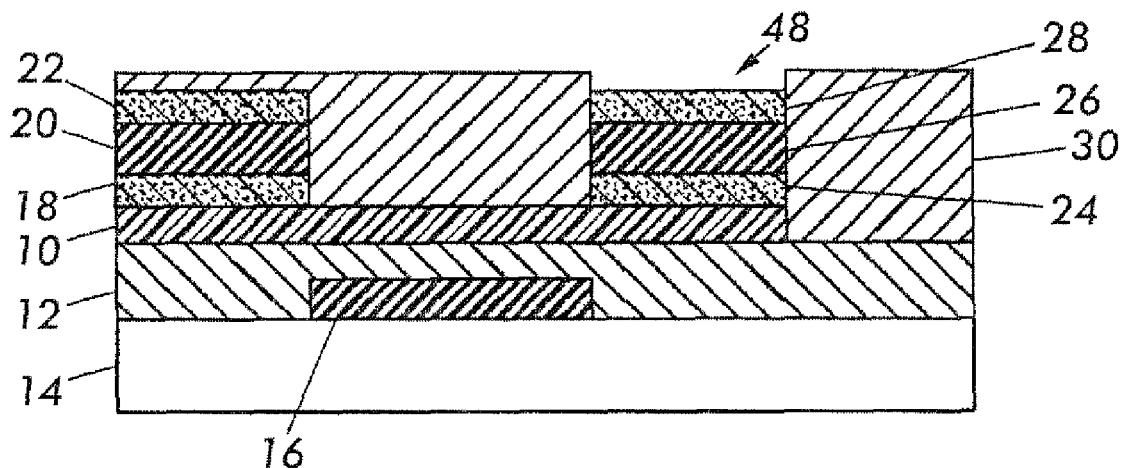

In FIG. 7, the structure is encapsulated. Encapsulation layer 30 is deposited over the, first sensor semiconductor layer 28, the semiconductor layer 22, the semiconductor island 10, and the gate insulator 12. The encapsulation layer 30 and the dielectric can, but need not be formed from the same material.

Figure 9:
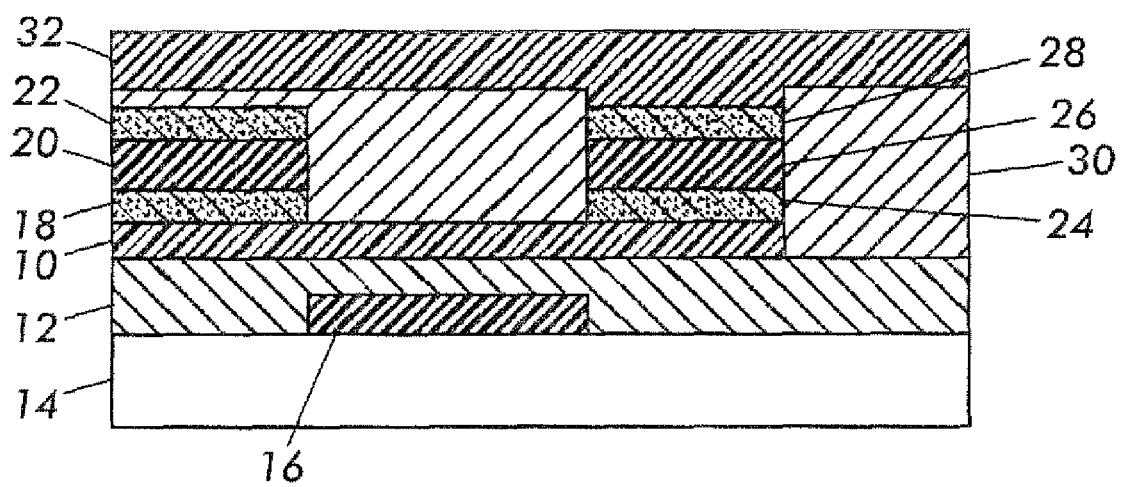

In FIG. 180, an opening 48 is formed in the encapsulation layer 30. The opening 48 exposes the first sensor semiconductor layer 28. In FIG. 9, the second sensor semiconductor layer 32 is deposited over the encapsulation layer 30. The second sensor semiconductor layer 32 can extend into the opening 48. As a result, the second sensor semiconductor layer 32 can contact the first sensor semiconductor layer 28.

Referring back to FIG. 1, the third semiconductor layer 34 can be deposited on the second sensor semiconductor layer 32. As a result, a PIN sensor has been formed with the third semiconductor layer 34, the second sensor semiconductor layer 32, and the first sensor semiconductor layer 28.

Since the first sensor semiconductor layer 28 was in direct contact to the conductive contact 26, the PIN sensor is in direct contact to the conductive contact 26. A transparent top contact layer (not shown) can be deposited over the sensor array. As described above, there is not a mushroom metal layer between the TFT and the PIN sensor. Accordingly, fewer layers are deposited, not only reducing cost and complexity, but also increasing reliability.

Although a particular structure of for a TFT has been described above, other structures can be used, but still having a direct connection between a semiconductor layer of a sensor and a source/drain contact of the TFT. For example, the TFT could be formed with a top gate structure. The semiconductor layer of the sensor can be formed on a source/drain contact and exposed by a via to the other semiconductor layers of the sensor. Accordingly, even with alternative transistor structures, the mushroom metal layer need not be included and the associated process for forming the mushroom metal layer need not be performed.

In an embodiment, referring to FIG. 9, the mask used to pattern the via 48 can be used to pattern the deposition of the second sensor semiconductor layer 32 and the third sensor semiconductor layer 34. A transparent conductive layer can be deposited over the patterned p-type semiconductor 34. Accordingly, a bias can be provided to each PIN sensor. Furthermore, this transparent conductive layer can serve as a protective layer. In an embodiment, the third semiconductor layer 42 can be patterned into the first sensor semiconductor layer 28, while either none or both of the sensor semiconductor layers 32 and 34 can be patterned.

In an embodiment, the encapsulation layer 30 can be increased in thickness due to a desired thickness of the first sensor semiconductor layer 28, described above. Although this increased thickness of the encapsulation layer 30 could result in cracking or other defects, the thickness of the first sensor semiconductor layer 28 and any other layers within an opening 33 in the encapsulation layer 30 can be adjusted to reduce the probability of defects.

Figure 10:
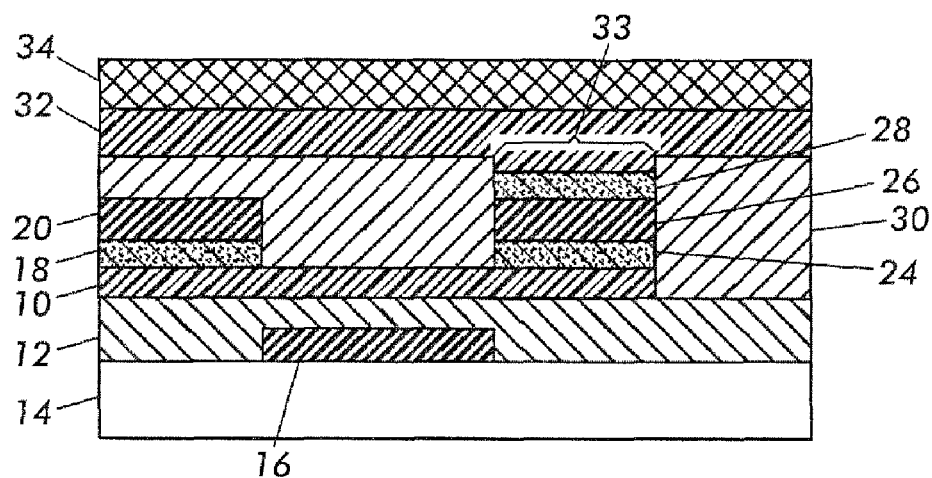
FIG. 10 is a cross-sectional view of a transistor and sensor in a sensor array according to another embodiment.

FIG. 10 is a cross-sectional view of a transistor and sensor in a sensor array according to another embodiment. The sensor array of FIG. 2 is similar to the sensor array of FIG. 1. However, the semiconductor layer 22 of FIG. 1 is not present. In contrast, the encapsulation layer 30 is formed directly on the conductive layer 20.

Figure 11:
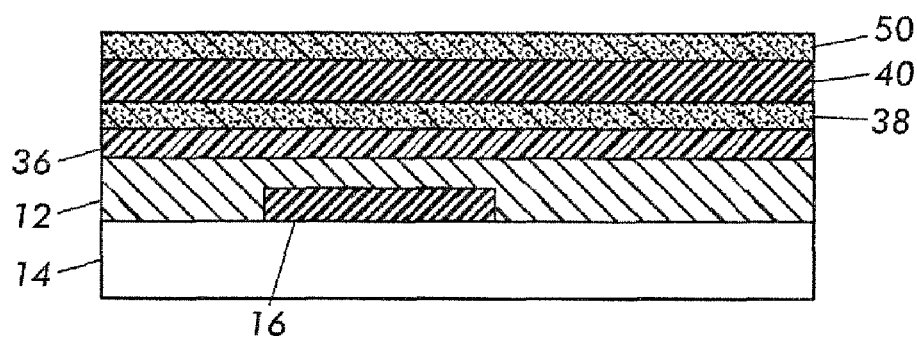
FIGS. 11-14 are cross-sectional views illustrating a process of forming a transistor and sensor in a sensor array according to another embodiment.

FIGS. 11-14 are cross-sectional views illustrating a process of forming a transistor and sensor in a sensor array according to another embodiment. FIG. 11 is similar to FIG. 4 in that a second semiconductor layer 38 and a conductive layer 40 are deposited on the first semiconductor layer 36. However, the third semiconductor layer 50 can be deposited without the thickness described in FIG. 4. The third semiconductor layer 50 can have a thickness substantially equal to a desired thickness for the PIN sensor. Although this thickness has been described as less than the thickness described with reference to FIG. 4, the thickness can be as desired, including the thickness described with reference to FIG. 4.

Figure 12:
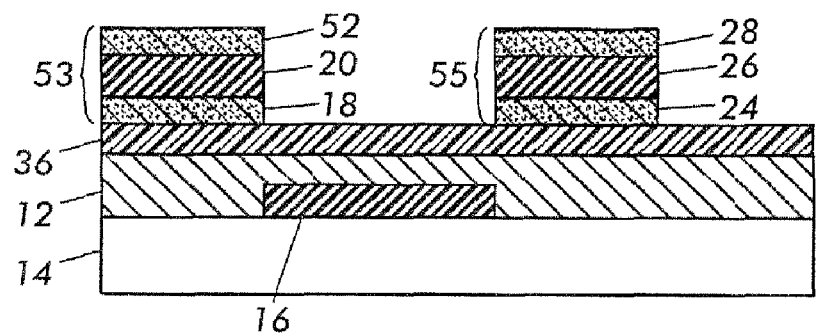

Similar to FIG. 5, in FIG. 12, the second semiconductor layer 38, conductive layer 40, and third semiconductor layer 50 can be patterned to form contact structures 53 and 55. First sensor semiconductor layer 28 is disposed on conductive contact 26. Semiconductor layer 52 is disposed on conductive contact 20.

Figure 13:
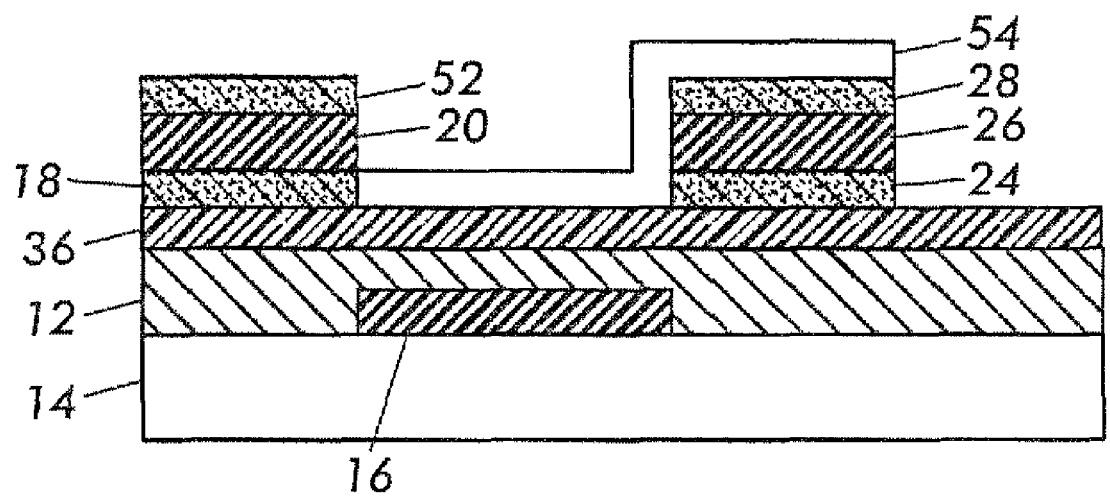

In FIG. 13, a protective layer 54 is applied to the first sensor semiconductor layer 28. However, it is not applied to the semiconductor 52. Note that the protective layer 54 can be part of or in addition to any mask or other protective layer used in the patterning the semiconductor layer 36.

Figure 14:
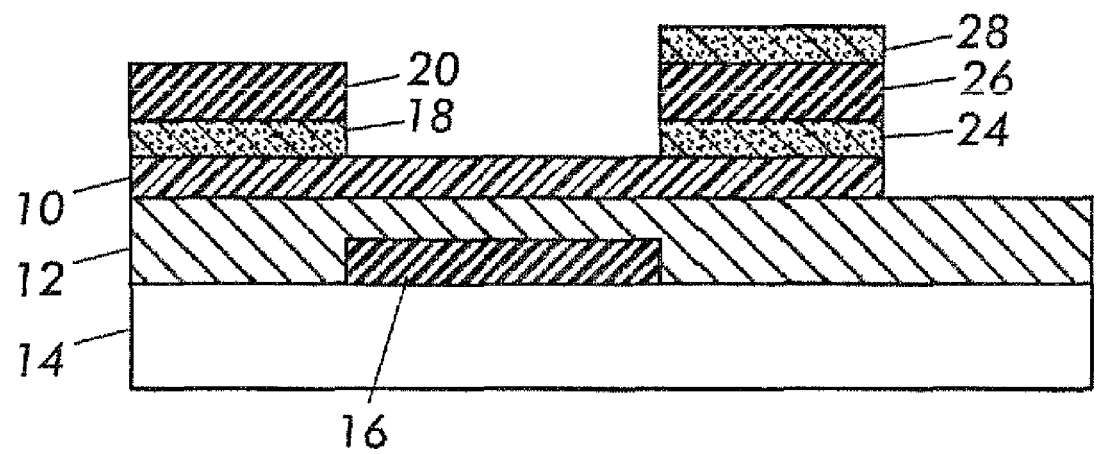

In FIG. 14, the semiconductor layer 36 is patterned to form the semiconductor island 10. The protective layer 54 can be removed. Since it was not covered by a protective layer, the semiconductor layer 52 may be removed. However, since it was protected by the protective layer 54, the first sensor semiconductor layer 28 can remain. The resulting structure can be processed as described above beginning with FIG. 7. That is, the structure can be encapsulated with encapsulation layer 30, an opening 48 formed, and the like. Accordingly, a resulting structure as shown by the example in FIG. 10 can be formed.

The structures described above can be coupled to a storage capacitor to store any charge from the PIN sensor. Such a capacitor and other circuitry present in the sensory array can be included, but have been omitted for clarity.

In an embodiment, the intrinsic semiconductor layer of the PIN sensor can block light that would otherwise be incident on the semiconductor island. As the transmission through the intrinsic semiconductor layer can be greater than zero, some leakage current may be induced in the TFT. However, an intrinsic semiconductor layer about 1 um thick can absorb light energy that is greater than about 2.1 eV. Accordingly, the amount and/or energy of the light that is incident on the semiconductor island, and consequently any induced leakage current, can be minimized without the need of the mushroom metal layer.

In an embodiment, the sensor array can be used for x-ray imager applications. In such applications, photon energy can be generated from excited phosphors over the sensor area. The phosphors can block incident visible irradiation. Accordingly, such radiation is prevented from being incident on the semiconductor island.

Another embodiment includes an article of machine readable code embodied on a machine readable medium that when executed, causes the machine to perform any of the above described operations. As used here, a machine is any device that can execute code. Microprocessors, programmable logic devices, multiprocessor systems, digital signal processors, personal computers, or the like are all examples of such a machine.

Although examples have been given with reference to a pixel circuit, the above structures and techniques can be used in any thin film transistor circuit. For example, the above structures and techniques can be used for any p-i-n sensor thin film transistor backplane.

Although particular examples of deposition, patterning, and the like have been given, any combination of deposition techniques can be used. For example, some or all of the layers can be printed rather than or in combination with other deposition, masking, etching, or other techniques.

Although particular doping of semiconductor layers have been given, any combination of semiconductor and conductive layers can be used.

Although particular embodiments have been described, it will be appreciated that the principles of the invention are not limited to those embodiments. Variations and modifications may be made without departing from the principles of the invention as set forth in the following claims.

What is claimed is:

1. A method of forming a sensor array, comprising:
   depositing a first semiconductor layer;
   depositing a source/drain contact layer over the first semiconductor layer;
   depositing a second semiconductor layer on the source/drain contact layer; and
   patterning the source/drain contact layer and the second semiconductor layer substantially simultaneously resulting in a patterned second semiconductor layer, a source contact, and a drain contact;
   patterning the first semiconductor layer;
   forming a protective layer over at least a part of the patterned second semiconductor layer; and
   removing the patterned second semiconductor layer exposed by the protective layer;
   wherein the patterned second semiconductor layer forms part of a sensor of the sensor array.

2. The method of claim 1, wherein patterning the first semiconductor layer occurs after forming the protective layer.

3. The method of claim 1, wherein:
   the second semiconductor layer is deposited directly on the source/drain contact layer.

4. The method of claim 1, further comprising:
   depositing an encapsulation layer over the patterned second semiconductor layer.

5. The method of claim 4, further comprising:
   forming an opening in the encapsulation layer to expose the patterned second semiconductor layer.

6. The method of claim 5, further comprising:
   depositing a third semiconductor layer over the second semiconductor layer;
   wherein at least part of the second semiconductor layer and at least part of the third semiconductor layer form the sensor.

7. The method of claim 6, further comprising:
   depositing a fourth semiconductor layer over the second semiconductor layer prior to depositing the third semiconductor layer;
   wherein the third semiconductor layer is formed over the fourth semiconductor layer.

8. The method of claim 7, wherein:
   the second semiconductor layer is an n-type semiconductor layer;
   the third semiconductor layer is a p-type semiconductor layer; and
   the fourth semiconductor layer is an intrinsic semiconductor layer.

9. The method of claim 6, wherein depositing the third semiconductor layer occurs after forming the opening in the encapsulation layer.

10. The method of claim 1, further comprising:
    patterning the first semiconductor layer to form islands after patterning the source/drain contact layer and the second semiconductor layer.

11. The method of claim 10, further comprising:
    depositing a gate conductive layer; and
    depositing a gate insulating layer over the gate conductive layer;
    wherein the first semiconductor layer is deposited over the gate insulating layer.

12. A method of forming a sensor array, comprising:
    depositing a source/drain contact layer;
    depositing a first semiconductor layer on the source/drain contact layer; and
    patterning the source/drain contact layer and the semiconductor layer substantially simultaneously resulting in a patterned first semiconductor layer;
    depositing an encapsulation layer over the patterned first semiconductor layer;
    forming an opening in the encapsulation layer to expose the patterned first semiconductor layer; and
    depositing a second semiconductor layer in the opening;
    wherein at least part of the patterned first semiconductor layer and at least part of the second semiconductor layer form at least part of a sensor of the sensor array;
    depositing a third semiconductor layer prior to depositing the source/drain contact layer, the source/drain contact layer deposited over the third semiconductor layer; and
    patterning the third semiconductor layer to form an island after patterning the source/drain contact layer and the first semiconductor layer;
    wherein depositing the second semiconductor layer includes depositing the second semiconductor layer over the island.

13. The method of claim 12, wherein forming the opening in the encapsulation layer comprises:
    forming the opening in the encapsulation layer such that substantially all of the patterned first semiconductor layer is exposed.

14. A method of forming a sensor array, comprising:
depositing a source/drain contact layer;
depositing a first semiconductor layer on the source/drain contact layer;
patterning the source/drain contact layer and the first semiconductor layer substantially simultaneously resulting in a patterned semiconductor layer;
forming a protective layer over at least a part of the patterned first semiconductor layer;
depositing a second semiconductor layer; and
patterning the second semiconductor layer after forming the protective layer;
wherein:
 the source/drain contact layer is deposited over the second semiconductor layer; and
 the patterned first semiconductor layer forms part of a sensor of the sensor array.

15. A method of forming a sensor array, comprising:
depositing a source/drain contact layer;
depositing a first semiconductor layer on the source/drain contact layer; and
patterning the source/drain contact layer and the first semiconductor layer substantially simultaneously resulting in a patterned first semiconductor layer;
depositing a second semiconductor layer;
patterning the second semiconductor layer to form islands after patterning the source/drain contact layer and the first semiconductor layer;
wherein:
 the source/drain contact layer is deposited over the second semiconductor layer; and
 the patterned first semiconductor layer forms part of a sensor of the sensor array.

16. The method of claim 15, further comprising:
depositing a gate conductive layer; and
depositing a gate insulating layer over the gate conductive layer;
wherein the second semiconductor layer is deposited over the gate insulating layer.

17. A method of forming a sensor array, comprising:
depositing a first semiconductor layer;
depositing a source/drain contact layer over the first semiconductor layer;
depositing a second semiconductor layer on the source/drain contact layer; and
patterning the source/drain contact layer and the second semiconductor layer substantially simultaneously resulting in a patterned second semiconductor layer, a source contact, and a drain contact;
patterning the first semiconductor layer;
depositing an encapsulation layer over the patterned second semiconductor layer; and
forming an opening in the encapsulation layer to expose the patterned second semiconductor layer;
wherein the patterned second semiconductor layer forms part of a sensor of the sensor array.

18. The method of claim 17, further comprising:
depositing a third semiconductor layer over the second semiconductor layer;
wherein at least part of the second semiconductor layer and at least part of the third semiconductor layer form the sensor.

19. The method of claim 18, further comprising:
depositing a fourth semiconductor layer over the second semiconductor layer prior to depositing the third semiconductor layer;
wherein the third semiconductor layer is formed over the fourth semiconductor layer.

20. The method of claim 19, wherein:
the second semiconductor layer is an n-type semiconductor layer;
the third semiconductor layer is a p-type semiconductor layer; and
the fourth semiconductor layer is an intrinsic semiconductor layer.

21. The method of claim 19, wherein depositing the third semiconductor layer occurs after forming the opening in the encapsulation layer.

\* \* \* \* \*